United States Patent
Zhang et al.

(10) Patent No.: US 6,348,654 B1
(45) Date of Patent: Feb. 19, 2002

(54) COMPOUND WAVEFORM GASKET FOR LOW CLOSURE FORCE EMI SHIELDING APPLICATIONS

(75) Inventors: Kai Zhang, Lawrence; Michael D. Harris, Saugus; Daniel S. Ventura, Newbury, all of MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 09/689,925

(22) Filed: Oct. 12, 2000

(51) Int. Cl.[7] .................................................. H05K 9/00
(52) U.S. Cl. .................................. 174/35 GC; 277/920
(58) Field of Search .......................... 174/35 GC, 35 R; 361/816, 818; 277/920

(56) References Cited

U.S. PATENT DOCUMENTS

| | | |
|---|---|---|
| 2,778,868 A | 1/1957 | Stinger |
| 4,652,695 A | 3/1987 | Busby |
| 4,857,668 A | 8/1989 | Buonanno |
| 4,952,448 A | 8/1990 | Bullock et al. |
| 5,008,485 A | 4/1991 | Kitagawa |
| 5,020,866 A | 6/1991 | McIllwraith |
| 5,028,739 A | 7/1991 | Keyser et al. |
| 5,039,825 A | 8/1991 | Samarov |
| 5,045,635 A | 9/1991 | Kaplo et al. |
| 5,105,056 A | 4/1992 | Hoge, Jr. et al. |
| 5,142,101 A | 8/1992 | Matsuzaki et al. |
| 5,147,121 A | 9/1992 | McIllwraith |
| 5,150,282 A | 9/1992 | Tomura et al. |
| 5,202,536 A | 4/1993 | Buonanno |
| 5,205,781 A * | 4/1993 | Schwartz et al. ............. 439/96 |
| RE34,393 E | 9/1993 | McIllwraith |
| 5,566,055 A | 10/1996 | Salvi, Jr. |
| 5,578,790 A | 11/1996 | Peregrim |
| 5,641,438 A | 6/1997 | Bunyan et al. |

(List continued on next page.)

FOREIGN PATENT DOCUMENTS

| | | |
|---|---|---|
| DE | 197 28 839 C1 | 9/1998 |
| EP | 0 654 962 A1 | 11/1994 |
| JP | 5-7177 | 1/1993 |

OTHER PUBLICATIONS

International Application Published Under the PCT, International Publication No. WO96/22672.
International Application Published Under the PCT, International Publication No. WO97/26782.
International Application Published Under the PCT, International Publication No. WO98/47340.

(List continued on next page.)

Primary Examiner—Dean A. Reichard
Assistant Examiner—Hung V Ngo
(74) Attorney, Agent, or Firm—John A. Molnar, Jr.

(57) ABSTRACT

A resilient EMI shielding and/or environmental sealing gasket for interposition between a first interface surface and an oppositely-disposed second interface surface. The gasket is formed of an elongate body of indefinite length which extends along a longitudinal axis. The body includes base and apex surfaces, and opposing first and second lateral surfaces which extend intermediate the base and apex surfaces. The base surface itself extends along the length the body as configured for proximally supporting the gasket on the first interface surface. The apex surface, in turn, extends radially from the longitudinal axis for distal contact with the second interface surface, and further extends along the longitudinal axis as defining a first waveform profile characterized as having a first periodic series of alternating first high and low amplitude intervals. The second lateral surface also extends along the longitudinal axis as defining a second waveform profile which is disposed generally transverse to the first waveform profile and which is similarly characterized as having a second periodic series of alternating second high and low amplitude intervals. The gasket so formed is deformable under a predetermined compressive force between the first and second interface surfaces into a stressed orientation characterized in that the body is deflected intermediate the base and apex surfaces.

26 Claims, 11 Drawing Sheets

U.S. PATENT DOCUMENTS

| | | |
|---|---|---|
| 5,731,541 A | 3/1998 | Bernd et al. |
| 5,847,317 A | 12/1998 | Phelps |
| 5,882,729 A | 3/1999 | Kahl et al. |
| 5,910,524 A | 6/1999 | Kalinoski |
| 6,096,158 A | 8/2000 | Kahl et al. |
| 6,096,413 A | 8/2000 | Kalinoski et al. |

OTHER PUBLICATIONS

International Application Published Under the PCT, International Publication No. WO98/54942.

International Application Published Under the PCT, International Publication No. WO99/40769.

International Application Published Under the PCT, International Publication No. WO99/43191.

Chomerics, Parker–Hannifin Corp., brochure entitled "EMI Shielding and Grounding Spacer Gaskets" dated 1996.

Processing of Single and Multi–component Adhesives and Sealants by Paul Ivanfi, together with translation (undated).

Chomerics Parker–Hannifin Corp. Technical Bulletin 22 entitled "Cho–Shield EMI Shielding Covers" dated 1996.

Parker Seals article entitled "Parshield Conductive Elastomers" dated 1993.

Article by Shu H. Peng and W. S. Vicent Teng of Chomerics Parker–Hannifin Corporation entitled "Recent Development in Elastomeric EMI Shielding Gasket Design" (undated).

Copy of Patent Application Serial No. 09/042,135 filed Mar. 13, 1998 and assigned to Parker–Hannifin Corporation, entitled Low Closure Force EMI Shielding Spacer Gasket.

Copy of Patent Application Serial No. 60/183,395 filed Feb. 18, 2000 and assigned to Parker–Hannifin Corporation, entitled "Manufacture of Low Closure Force, Form–in–Place EMI Shleiding Gasket".

* cited by examiner

COMPOUND WAVEFORM GASKET FOR LOW CLOSURE FORCE EMI SHIELDING APPLICATIONS

BACKGROUND OF THE INVENTION

The present invention relates broadly to gaskets for providing environmental sealing and/or electromagnetic interference (EMI) shielding, and particularly to a low closure force EMI shielding gasket which is especially adapted for use within small electronics enclosures such as cellular phone handsets and other handheld electronic devices.

The operation of electronic devices such as televisions, radios, computers, medical instruments, business machines, communications equipment, and the like is attended by the generation of electromagnetic radiation within the electronic circuitry of the equipment. As is detailed in U.S. Pat. Nos. 5,202,536; 5,142,101; 5,105,056; 5,028,739; 4,952,448; and 4,857,668, such radiation often develops as a field or as transients within the radio frequency band of the electromagnetic spectrum, i.e., between about 10 KHz and 10 GHz, and is termed "electromagnetic interference" or "EMI" as being known to interfere with the operation of other proximate electronic devices.

To attenuate EMI effects, shielding having the capability of absorbing and/or reflecting EMI energy may be employed both to confine the EMI energy within a source device, and to insulate that device or other "target" devices from other source devices. Such shielding is provided as a barrier which is inserted between the source and the other devices, and typically is configured as an electrically conductive and grounded housing which encloses the device. As the circuitry of the device generally must remain accessible for servicing or the like, most housings are provided with openable or removable accesses such as doors, hatches, panels, or covers. Between even the flattest of these accesses and its corresponding mating or faying surface, however, there may be present gaps which reduce the efficiency of the shielding by presenting openings through which radiant energy may leak or otherwise pass into or out of the device. Moreover, such gaps represent discontinuities in the surface and ground conductivity of the housing or other shielding, and may even generate a secondary source of EMI radiation by functioning as a form of slot antenna. In this regard, bulk or surface currents induced within the housing develop voltage gradients across any interface gaps in the shielding, which gaps thereby function as antennas which radiate EMI noise. In general, the amplitude of the noise is proportional to the gap length, with the width of the gap having less appreciable effect.

For filling gaps within mating surfaces of housings and other EMI shielding structures, gaskets and other seals have been proposed both for maintaining electrical continuity across the structure, and for excluding from the interior of the device such contaminates as moisture and dust. Such seals are bonded or mechanically attached to, or press-fit into, one of the mating surfaces, and function to close any interface gaps to establish a continuous conductive path thereacross by conforming under an applied pressure to irregularities between the surfaces. Accordingly, seals intended for EMI shielding applications are specified to be of a construction which not only provides electrical surface conductivity even while under compression, but which also has a resiliency allowing the seals to conform to the size of the gap. The seals additionally must be wear resistant, economical to manufacture, and capability of withstanding repeated compression and relaxation cycles. For further information on specifications for EMI shielding gaskets, reference may be had to Severinsen, J., "Gaskets That Block EMI," Machine Design, Vol. 47, No. 19, pp. 74–77 (Aug. 7, 1975).

EMI shielding gaskets typically are constructed as a resilient core element having gap-filling capabilities which is either filled, sheathed, or coated with an electrically conductive element. The resilient core element, which may be foamed or unfoamed, solid or tubular, typically is formed of an elastomeric thermoplastic material such as polyethylene, polypropylene, polyvinyl chloride, or a polypropylene-EPDM blend, or a thermoplastic or thermosetting rubber such as a butadiene, styrene-butadiene, nitrile, chlorosulfonate, neoprene, urethane, or silicone rubber.

Conductive materials for the filler, sheathing, or coating include metal or metal-plated particles, fabrics, meshes, and fibers. Preferred metals include copper, nickel, silver, aluminum, tin or an alloy such as Monel, with preferred fibers and fabrics including natural or synthetic fibers such as cotton, wool, silk, cellulose, polyester, polyamide, nylon, polyimide. Alternatively, other conductive particles and fibers such as carbon, graphite, or a conductive polymer material may be substituted.

Conventional manufacturing processes for EMI shielding gaskets include extrusion, molding, or die-cutting, with molding or die-cutting heretofore being preferred for particularly small or complex shielding configurations. In this regard, die-cutting involves the forming of the gasket from a cured sheet of an electrically-conductive elastomer which is cut or stamped using a die or the like into the desired configuration. Molding, in turn, involves the compression or injection molding of an uncured or thermoplastic elastomer into the desired configuration.

More recently, a form-in-place (FIP) process has been proposed for the manufacture of EMI shielding gaskets. As is described in commonly-assigned U.S. Pat. Nos. 6,096,413; 5,910,524; and 5,641,438, and PCT Application WO 96/22672; and in U.S. Pat. Nos. 5,882,729 and 5,731,541; and Japanese Patent Publication (Kokai) No. 7177/1993, such process involves the application of a bead of a viscous, curable, electrically-conductive composition which is dispensed in a fluent state from a nozzle directly onto to a surface of a substrate such as a housing or other enclosure. The composition, typically a silver-filled or otherwise electrically-conductive silicone elastomer, then is cured-in-place via the application of heat or with atmospheric moisture or ultraviolet (UV) radiation to form an electrically-conductive, elastomeric EMI shielding gasket in situ on the substrate surface.

Another recent EMI shielding solution for electronics enclosures, which solution is further described in commonly-assigned U.S. Pat. No. 5,566,055 and in DE 19728839 involves the over-molding of the housing or cover with an conductive elastomer. The elastomer is integrally molded in a relatively thin layer across the inside surface of the housing or cover, and in a relatively thicker layer along the interface locations thereof providing both a gasket-like response for environmentally sealing the cover to the housing and electrical continuity for the EMI shielding of the enclosure. The elastomer additionally may be molded onto interior partitions of the cover or housing, or itself molded to integrally-form such partitions, providing electromagneticly-isolated compartments between potentially interfering circuitry components. Covers of such type are marketed commercially under the name Cho-Shield® Cover by the Chomerics EMC Division of Parker-Hannifin Corporation (Woburn, Mass.).

Yet another solution for shielding electronics enclosures, and particularly the smaller enclosures typical of cellular phone handsets and other handheld electronic devices, concerns the incorporation of a thin plastic retainer or frame as a supporting member of the gasket. As is described in commonly-assigned, co-pending application U.S. Ser. No. 08/377,412 filed Jan. 24, 1995, the electrically conductive elastomer may be molded or, as is described in U.S. Pat. No. 5,731,541, formed-in-place or otherwise attached to the inner or inner peripheral edge surfaces and/or to the upper or lower face surfaces of the frame. So constructed, the gasket and frame assembly may be integrated within the electronic device to provide a low impedance pathway between, for example, peripheral ground traces on a printed circuit board (PCB) of the device, and other components thereof such as the conductive coating of a plastic housing, another PCB, or a keypad assembly. Uses for the spacer gaskets of the type herein include EMI shielding applications within digital cellular, handyphone, and personal communications services (PCS) handsets, PC cards (PCMCIA cards), global positioning systems (GPS), radio receivers, and other handheld devices such as personal digital assistants (PDAs). Other uses include as replacements for metal EMI shielding "fences" on PCBs in wireless telecommunication devices.

Requirements for typical small enclosure applications generally specify a low impedance, low profile connection which is deflectable under relatively low closure force loads, e.g., about 1.0–8.0 lbs per inch (0.2–1.5 kg per cm) of gasket length. Usually, a minimum deflection, typically of about 10%, also is specified to ensure that the gasket sufficiently conforms to the mating housing or board surfaces to develop an electrically conductive pathway therebetween. It has been observed that for certain applications, however, that the closure or other deflection force required to effect the specified minimum deflection of conventional profiles may be higher than can be accommodated by the particular housing or board assembly design.

One method of achieving a lower closure force gasket design particularly adapted for use in smaller electronic enclosure packages has been to form the gasket as having a periodic "interrupted" pattern of alternating local maxima and minima heights. Conventionally, and as is described in commonly-assigned, co-pending applications U.S. Ser. No. 09/042,135, filed Mar. 13, 1998, and U.S. Ser. No. 60/183, 395, filed Feb. 18, 2000, in the Technical Publication "EMI Shielding and Grounding Spacer Gasket," Parker Chomerics Division, Woburn, Mass. (1996), and in PCT application 98/54942, gaskets of such type may be formed by molding or the FIP process as having a crenelated, i.e., notched, serrated, or a sinusoidal "waveform" profile, or as a series of discrete beads. In general, for a specified joint configuration, a gasket having such an "interrupted" profile or pattern would be expected to exhibit a greater deflection under a given compressive load than a continuous profile.

A commercial waveform gasket assembly representative of the existing state of the art is shown generally at 1 in the perspective view of FIG. 1 and in the top view of FIG. 2 as including a length of electrically-conductive, elastomeric gasket 2, which may be formulated as a silver or silver-plated-filled silicone or fluorosilicone material, which is bonded by injection or compression molding along a landed edge, referenced at 3 in FIG. 1, of a housing 4. Housing 4 may be formed of a plastic material such as ABS, polycarbonate, nylon, polyester, polyetherimide, a liquid crystal polymer (LCP), or the like which is provided with a metallized coating to render the interior surface, 5, thereof electrically-conductive. Alternatively, housing 4 may be formed of a relatively lightweight metal such as magnesium or aluminum.

In basic geometry, the distal edge, 6, of gasket 2 assumes a generally sinusoidal profile. Functionally, the elastomeric gasket 2 deforms via a compression mode with the troughs of the waveform acting as compression stops. Such deformation response of gasket 2 is illustrated in FIG. 2' wherein a 3-D mesh model of a cross-section thereof is shown in phantom at 7 in an uncompressed or normal orientation which is superimposed over the deformed or stressed orientation referenced at 8 assumed upon the compression of gasket 2 between the edge surface 3 (not shown in FIG. 2') and a faying interface surface, represented by the plane referenced in phantom at 9. As is confirmed in FIG. 2', gasket 2 exhibits a deformation response which is mainly in compression, with the darker areas of shading indicating regions of increasing compressive stress.

As the sizes of handheld electronic devices such as cellular phone handsets has continued to shrink, it will be appreciated that further improvements in the design of gaskets profiles therefor would be well-received by the electronics industry. Especially desired would be a low closure force gasket profile which is adapted for use in the smaller electronics enclosures which are increasingly becoming the industry standard.

BROAD STATEMENT OF THE INVENTION

The present invention is directed to a low closure force gasket for environmental sealing and/or electromagnetic interference (EMI) shielding which is especially adapted for use in smaller electronic enclosure packages. As in conventional designs, the gasket of the present invention is configured as having an apex surface which is formed, relative to the housing or other substrate on which the base of the gasket may be supported, to exhibit a sinusoidal or other "waveform" profile to be responsive to lower closure force loads when compressed intermediate a pair of surfaces such as between two halves of a housing. However, the gasket of the invention further is configured, such as in having, for example, at least one lateral surface which is formed, relative to the apex surface, as a transverse waveform profile, to exhibit a controlled deflection response which may be characterized as a bending moment. Such response advantageously provides a large but controlled deflection affording a more uniform interface contact with the contacting surface for more assured electrical and physical continuity and, in turn, more reliable EMI shielding and environmental sealing effectiveness. When employed, for example, in electronics applications, the gasket of the invention therefore provides consistent EMI shielding and, additionally, environmental sealing effectiveness.

Advantages of the present invention therefore include the provision of an improved gasket profile for low closure force applications such as may be found in small, handheld electronic devices. Additional advantages includes a gasket profile which exhibits a controlled deflection response for more stable interface contact with the housing or circuit board components of the enclosure and, in turn, more assured electrical continuity and reliable EMI shielding effectiveness. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

Figure 1:
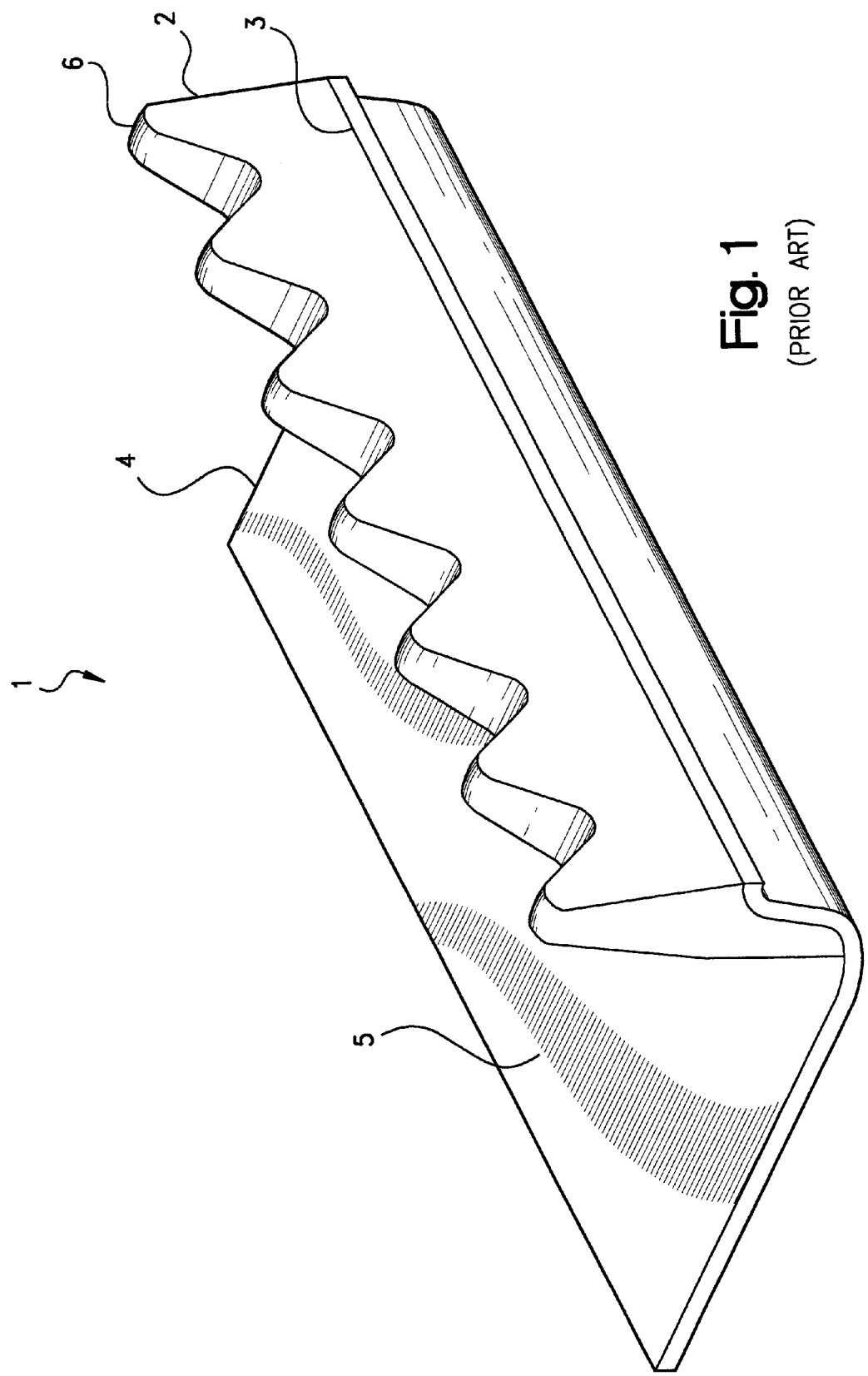
FIG. 1 is a perspective end view, partly in cross-section, of a portion of a housing for a handheld electronic communication device having molded on an edge thereof a "waveform" EMI shielding gasket representative of the prior art.
Figure 2:
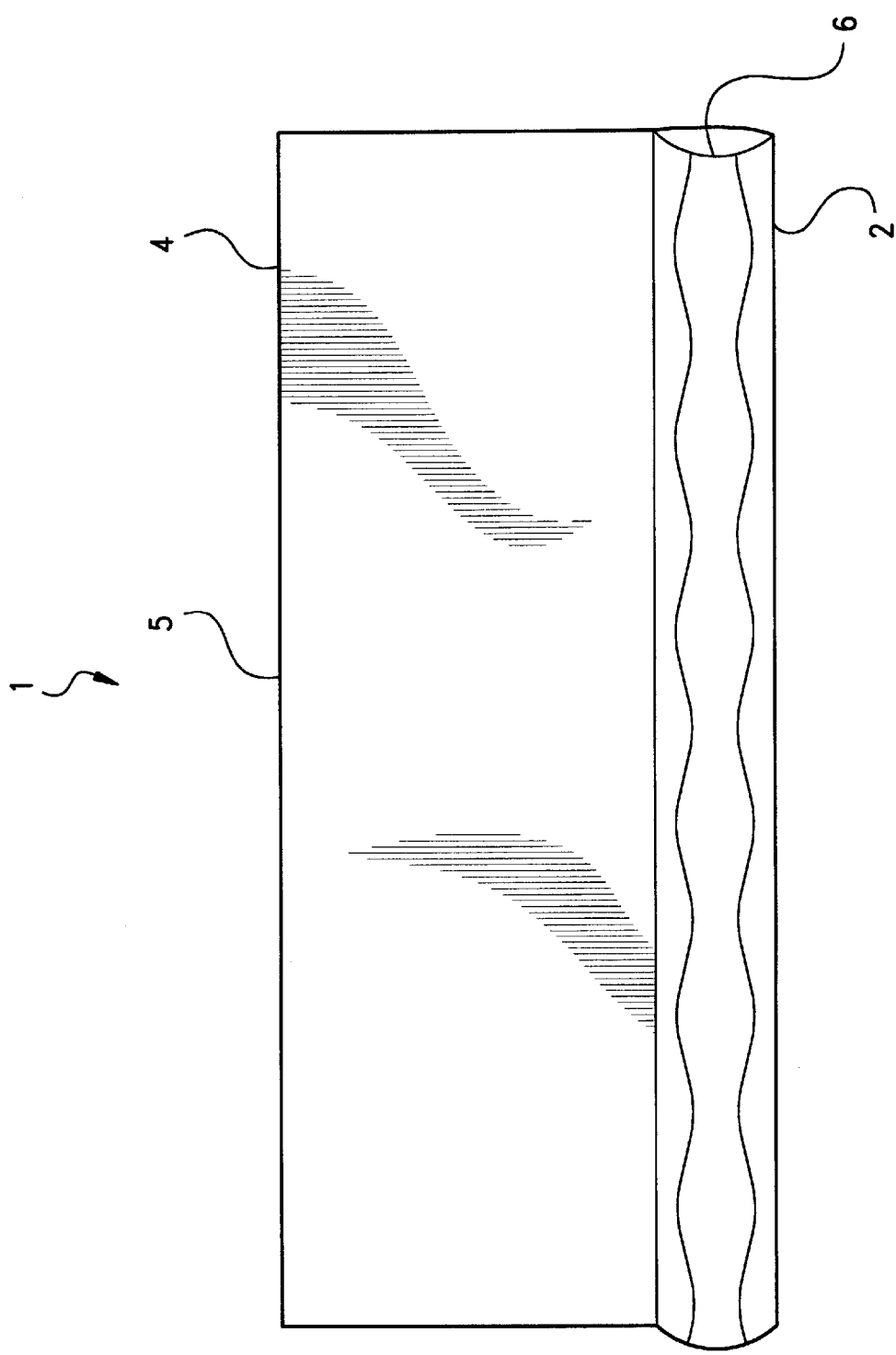
FIG. 2 is a top view of the housing of FIG. 1.
Figure 3:
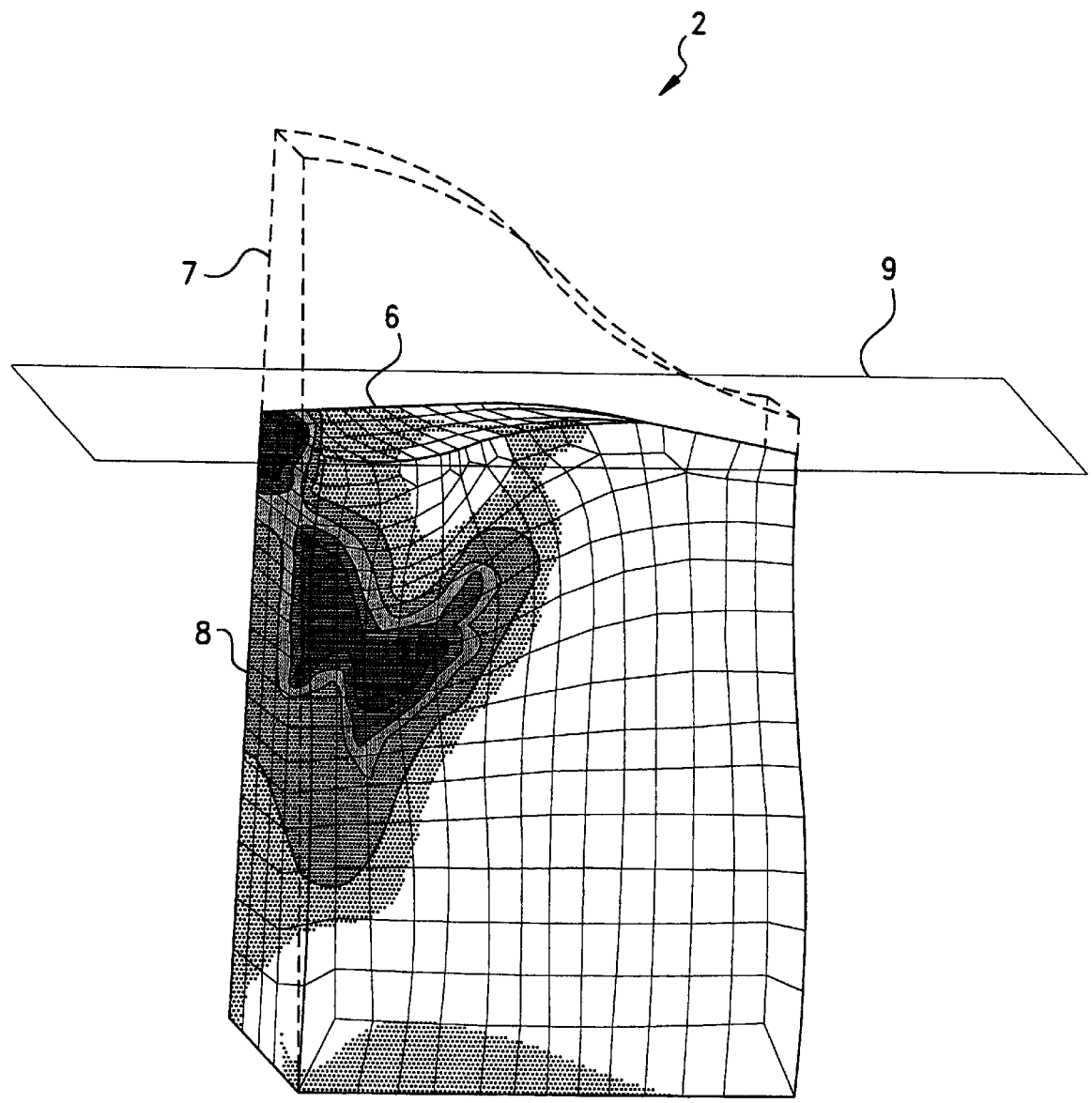
FIG. 3 is 3-D mesh model of a cross-section of the prior art waveform gasket of FIG. 1 showing the compression response thereof.

The drawings will be described further in connection with the following Detailed Description of the Invention.

DETAILED DESCRIPTION OF THE INVENTION

Certain terminology may be employed in the description to follow for convenience rather than for any limiting purpose. For example, the terms "forward," "rearward," "right," "left," "upper," and "lower" designate directions in the drawings to which reference is made, with the terms "inward," "inner," or "inboard" and "outward," "outer," or "outboard" referring, respectively, to directions toward and away from the center of the referenced element, and the terms "radial" and "axial" referring, respectively, to directions perpendicular and parallel to the central longitudinal axis of the referenced element. Terminology of similar import other than the words specifically mentioned above likewise is to be considered as being used for purposes of convenience rather than in any limiting sense.

In the figures, elements having an alphanumeric designation may be referenced herein collectively or in the alternative, as will be apparent from context, by the numeric portion of the designation only. Further, the constituent parts of various elements in the figures may be designated with separate reference numerals which shall be understood to refer to that constituent part of the element and not the element as a whole. General references, along with references to spaces, surfaces, dimensions, and extents, may be designated with arrows.

For the purposes of the discourse to follow, the precepts of the invention herein involved are described in connection with the molding or other application of an elastomeric, electrically-conductive, electromagnetic interference (EMI) shielding gasket onto an edge or other surface of one part of an enclosure for a handheld electronic device such as a cellular telephone. In view of the discourse to follow, however, it will be appreciated that aspects of the present invention may find utility in other EMI shielding applications, such as for spacer frame gaskets, circuit boards, or EMI shielding caps, or in non-electrically-conductive and/or thermally-conductive embodiments for environmental sealing and/or heat transfer applications. Use within those such other applications therefore should be considered to be expressly within the scope of the present invention.

Figure 4:
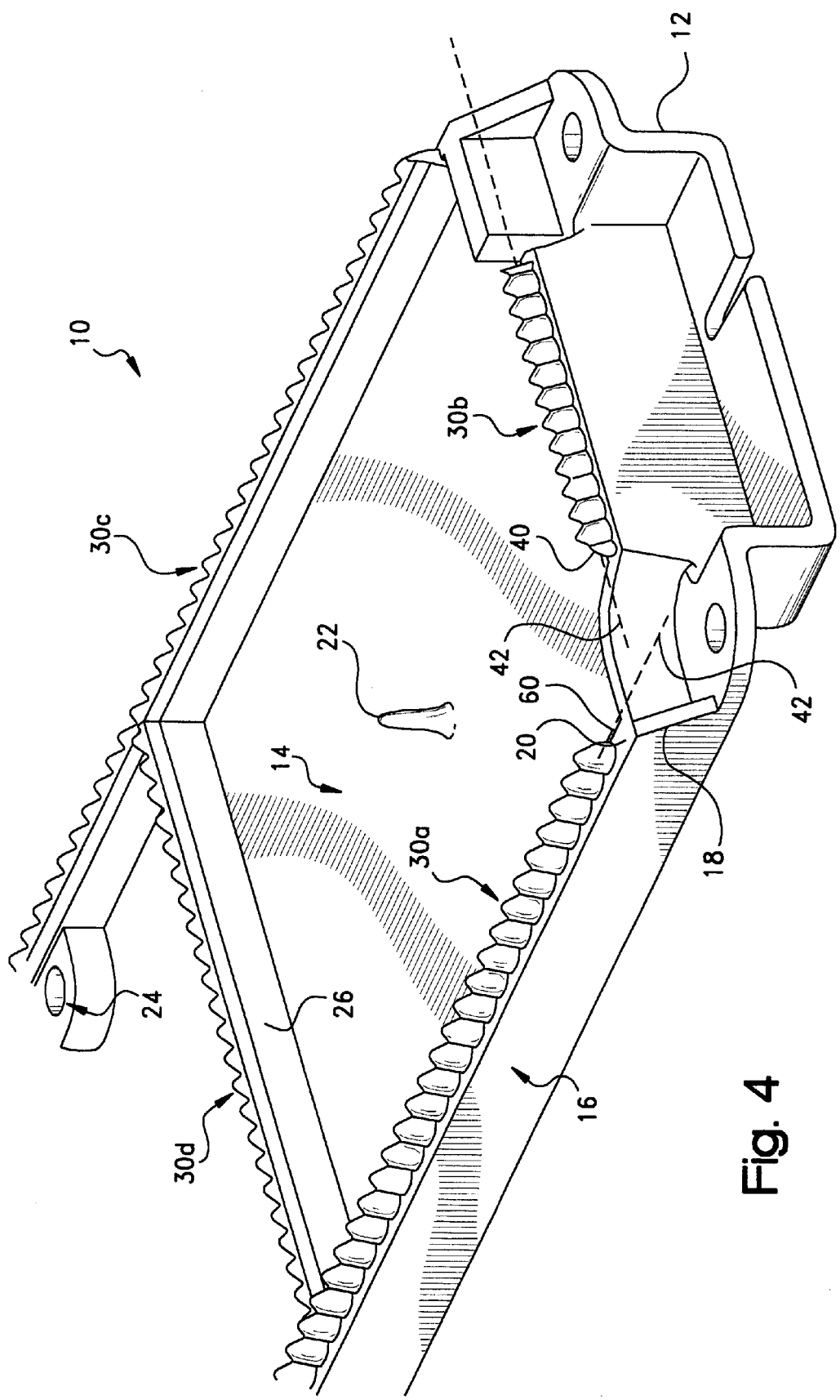
FIG. 4 is a perspective view end view, partly in cross-section, of a portion of a representative EMI shielding assembly which includes a housing part along the edges of which is molded one embodiment of a combination waveform gasket in accordance with the present invention.

Referring then to the figures, an exemplary sealing assembly for EMI shielding applications is shown generally at 10 in FIG. 4 as including a housing part or other enclosure, 12, for an electronic device which may be a cellular telephone or, alternatively another handheld or other electronic device such as a personal communications services (PCS) handset, PCMCIA card, global positioning system (GPS), radio receiver, personal digital assistant (PDA), or the like. Housing part 12 has an inner surface, 14, and an outer surface, 16, which extend to form sides walls, one of which is referenced at 18, therebetween having a peripheral edge surface, 20. Edge surface 20 functions as an interface surface with a faying edge or other interfacing surface of a mating housing part (not shown). For assuring the positive positioning of the mating parts, each of the parts may be formed as having one or more positioning pins, one of which is referenced at 22 on part 12, receivable within a corresponding hole, such as the hole 24 of part 12, provided in the mating housing part. Typically, the interior of the housing part 12 is divided into to more separate cavities, such as by an internal wall, 26, for providing electromagnetically isolated compartments between potentially interfering circuitry.

For many applications, housing part 12 may be injection or otherwise molded of a thermoplastic or other polymeric material such as a poly(ether ether ketone), polyimide, high molecular weight polyethylene, polypropylene, polyetherimide, polybutylene terephthalate, nylon, fluoropolymer, polysulfone, polyester, ABS, acetal homo or copolymer, or a liquid crystal polymer. In the case of an electrically-nonconductive material, the housing part inner surface 14 may be painted, metallized, or otherwise provided with a metal or metal-filled coating layer. Alternatively, housing part 12 may be formed of a relatively lightweight metal such as magnesium or aluminum.

Figure 5:
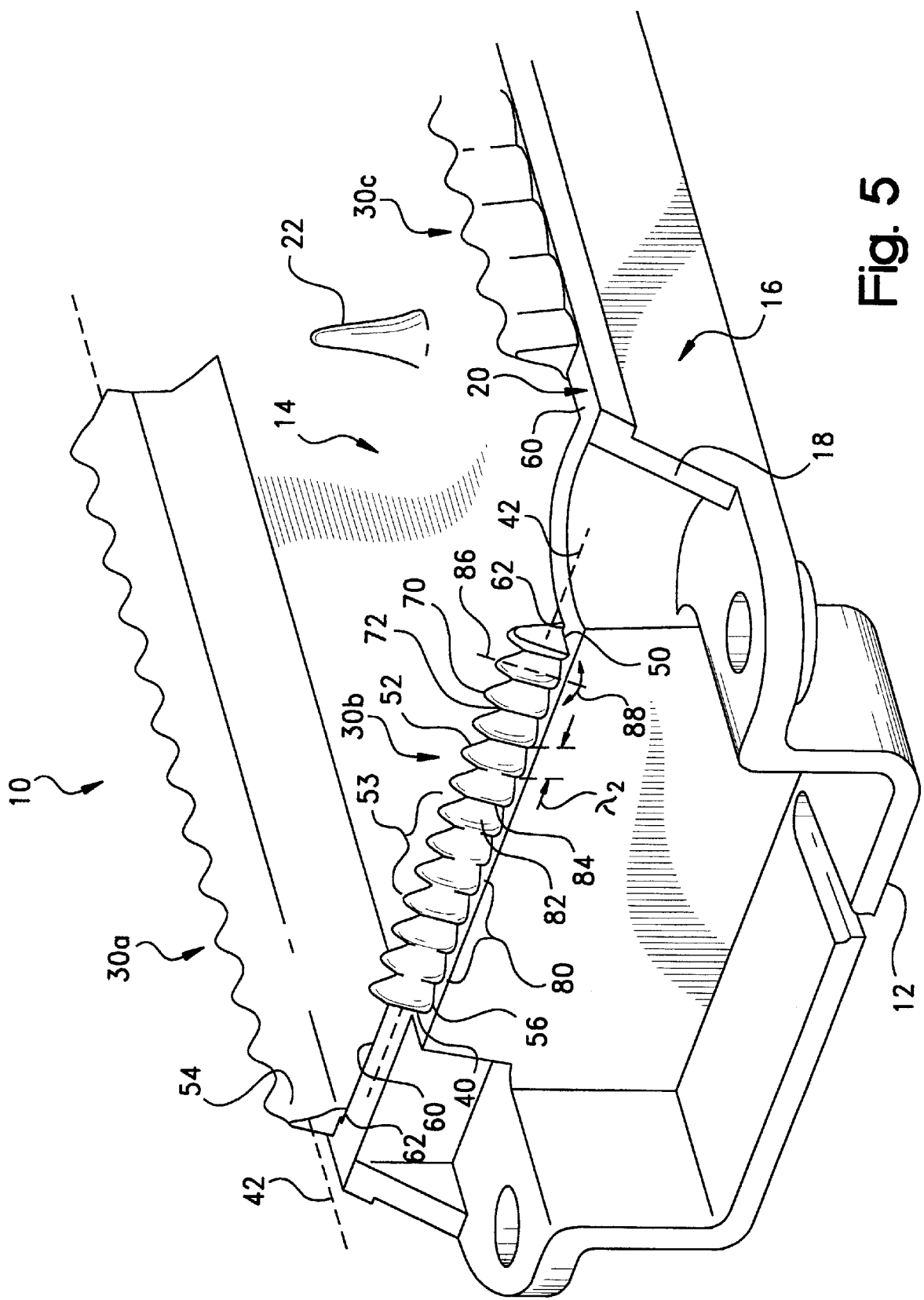
FIG. 5 is a magnified view rotated 90° of the EMI shielding assembly of FIG. 4.
Figure 6:
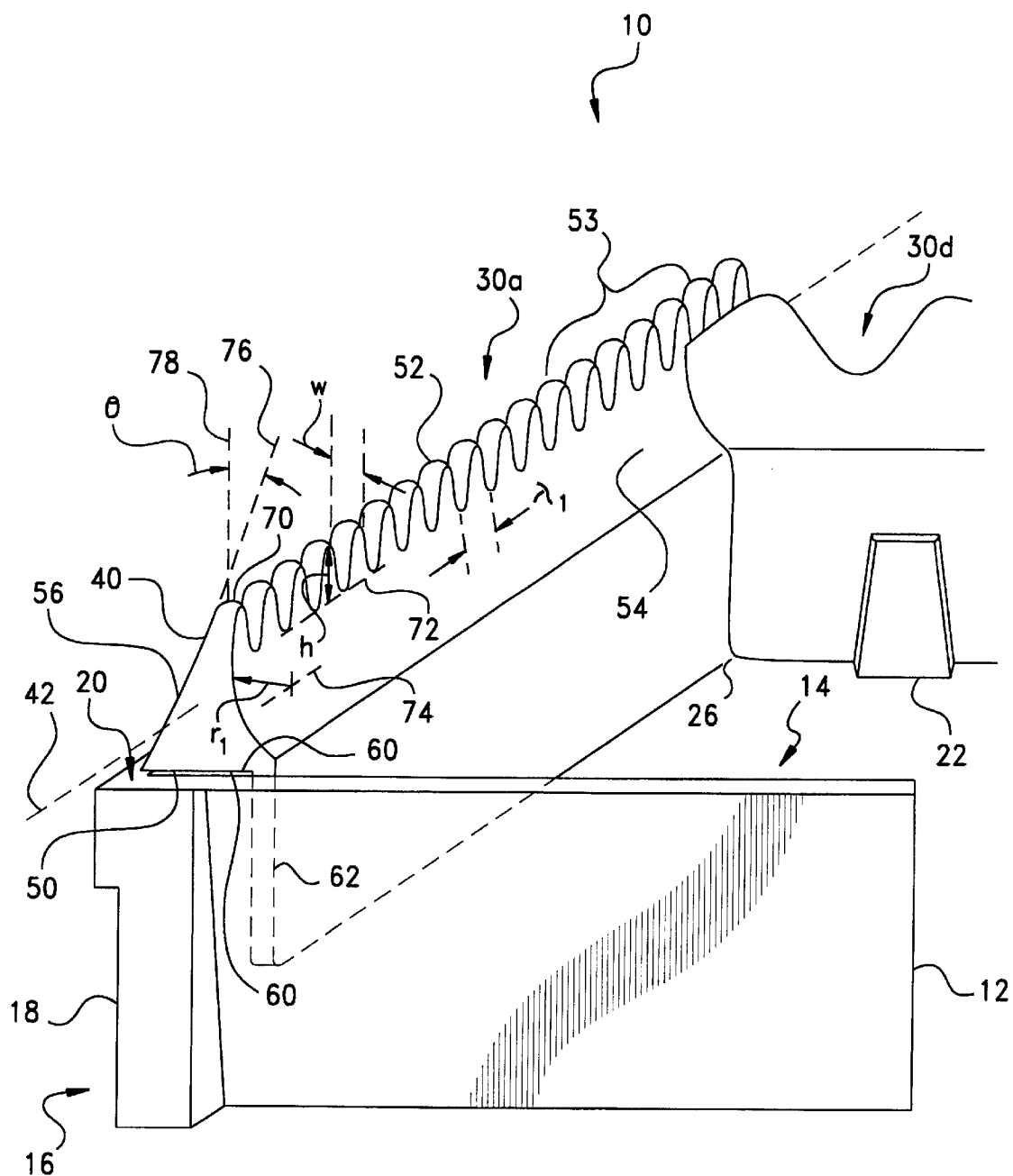
FIG. 6 is a further magnified view of the EMI shielding assembly of FIG. 5 showing the cross-section of the waveform gasket of the present invention in enhanced detail.

As may be seen with additional reference to the magnified views of FIGS. 5 and 6, a resilient gasket, the constitute segments of which are referenced at 30a–d, is molded or otherwise retained, such as by adhesive bonding or an interference fit, on side wall 18 and optionally, internal wall 26, to be compressible axially under a predetermined compressive load intermediate edge surface 20 and the corresponding surface of the mating housing part (not shown in FIGS. 4–6). In this regard, gasket 30 preferably is over-molded onto the sidewall edge surface 20 by injection or compression molding as formed of an elastomeric material which specifically may be selected for temperature, chemical, or physical compatibility with the housing material. Depending then upon the application, suitable materials may include natural rubbers such as Hevea, as well as thermoplastic, i.e., melt-processible, or thermosetting, i.e., vulcanizable, synthetic rubbers such as fluoropolymers, chlorosulfonate, polybutadiene, polybutadiene, buna-N, butyl, neoprene, nitrile, polyisoprene, silicone, fluorosilicone, copolymer rubbers such as ethylene-propylene (EPR), ethylene-propylene-diene monomer (EPDM), nitrile-butadiene (NBR) and styrene-butadiene (SBR), or blends such as ethylene or propylene-EPDM, EPR, or NBR. The term "synthetic rubbers" also should be understood to encompass materials which alternatively may be classified broadly as thermoplastic or thermosetting elastomers such as polyurethanes, silicones, fluorosilicones, styrene-isoprene-styrene (SIS), and styrene-butadiene-styrene (SBS), as well as other polymers which exhibit rubber-like properties such as plasticized nylons, polyesters, ethylene vinyl acetates, and polyvinyl chlorides. As used herein, the term "elastomeric" is ascribed its conventional meaning of exhibiting rubber-like properties of compliancy, resiliency or compression deflection, low compression set, flexibility, and an ability to recover after deformation.

Preferably for EMI shielding applications, the elastomeric material is selected to be a silicone or fluorosilicone material. In general, silicone elastomers exhibit desirable properties such as thermal and oxidation resistance over a wide temperature range, as well as resistance to many chemicals and to weather effects. These materials further exhibit excellent electrical properties including resistance to corona breakdown over a wide range of temperatures and humidity.

For EMI shielding applications, the silicone or other elastomeric material may be rendered electrically conductive for providing an electrically conductive pathway between the interfacing surfaces via the loading of a continuous binder phase of the material with an electrically-conductive filler. Suitable electrically-conductive fillers include nickel and nickel-plated substrates such as graphite and noble metals, and silver and silver-plated substrates such as: pure silver; silver-plated noble metals such as silver-plated gold; silver-plated non-noble metals such as silver-plated copper, nickel, aluminum, and tin; and silver-plated glass, ceramics, plastics, elastomers, and mica; and mixtures thereof. The shape of the filler is not considered critical to the present invention, and may include any shape that is conventionally involved in the manufacture or formulation of conductive materials of the type herein involved including solid spheres, hollow microspheres, elastomeric balloons, flakes, platelets, fibers, rods, or irregularly-shaped particles. Similarly, the particle size of the filler is not considered critical, but generally will be in the range of from about 0.250–250 µm, with a range of from about 0.250–75 µm being preferred.

The filler is loaded in the composition in a proportion sufficient to provide the level of electrical conductivity and EMI shielding effectiveness in the cured gasket which is desired for the intended application. For most applications, an EMI shielding effectiveness of at least 10 dB, and preferably at least 20 dB, and most preferably at least 100 dB or higher, over a frequency range of from about 10 MHz to 12 GHz is considered acceptable. Such effectiveness translates to a filler proportion which generally is between about 10–80% by volume, based on the total volume of the reaction system, and preferably is between about 20–70% by volume. As is known, however, the ultimate shielding effectiveness of the cured gasket will vary based on the amount of electrically-conductive material in the filler and the imposed load or deflection, typically between about 10–50%, of the gasket.

Alternatively, the electrically conductive filler may be provided as a relatively thin, i.e., 1–10 mils (0.025–0.25 mm), plating or coating layer covering gasket 30. In the case of a coating, such layer may be formulated as a silicone, fluorosilicone, or other elastomeric binder which forms a continuous phase within which the filler is dispersed.

Returning to FIGS. 4–6, it may be seen that in the uncompressed or normal state shown, the constituent segments 30a–b of gasket 30 each is formed as an elongate body 40, of an indefinite length which extends along a longitudinal axis, which axis is shown as the central axis commonly referenced at 42 for the gasket segments 30a and 30b. Depending upon the configuration of housing part 12, gasket 30 and, accordingly, body 40 thereof may be continuous or discontinuous, and may trace a linear, curved, rectilinear, curvilinear, or other shape path along longitudinal axis 42.

With particular reference to the magnified views of FIGS. 5 and 6, body 40 may be seen to be configured in accordance with the precepts of the present invention as having a compound waveform profile which effects a controlled deflection response in the gasket 30. In basic construction, such profile includes a base or bottom surface, 50, an apex or top surface, 52, which defines the first waveform profile, a portion of which is referenced at 53, of the gasket 30, an inboard lateral surface, 54, and an outboard lateral surface, 56, which is disposed opposite the inboard lateral surface 54 and which defines the second waveform profile of the gasket. As may be seen, all of the surfaces 50, 52, 54, and 56 may be integrally formed within body 40.

Base surface 50 in the illustrated configuration of gasket 30 is generally planar and extends generally parallel to the housing part edge surface 20 along the length of the gasket body 40. With gasket 30 being molded or otherwise bonded or attached to the edge surface 20, base surface 50 thereby proximal supports the gasket on the surface 20 for compression therebetween and the faying interface surface (not show in FIGS. 5 and 6) of, for example, the mating housing part. Depending, however, on the geometry or orientation of the edge surface 20, base surface 50 alternatively may be configured, for example, as being beveled or chamfered to correspond to any beveling or chamfering of the inboard corner 60 of surface 20. Moreover in the illustrative embodiment of FIGS. 5 and 6, base surface 50 further is formed as having an extension portion, which may be best seen in phantom at 62 in FIG. 6, depending therefrom, that is bonded or otherwise secured to the inner surface 14 of the side wall 18. It will be understood that extension portion 62 provides additional surface area as well as a shear surface attachment for further securing, such as by self-adhesive molding or adhesive bonding, the gasket body 40 to the housing part 12.

Apex surface 52 extends radially from longitudinal axis 42 as spaced-apart from base surface 50 for distal contact with the faying interface surface (not shown). In the illustrated embodiment of FIGS. 5 and 6, apex surface 52 defines the first waveform profile 53 of gasket 30 as extending along longitudinal axis 42 in a first periodic series of alternating first high amplitude intervals or crests, one of which is referenced at 70, and first low amplitude intervals or troughs, one of which is referenced at 72. The first waveform profile 53 defined by apex surface 52 may be of any pattern, such as square-wave, ramp, or sawtooth, but in the illustrated embodiment of FIG. 6 is shown to generally be sinusodial and as having a given, preferably constant, wavelength, referenced at $\lambda_1$, which may be between about 0.01–0.50 inches (0.25–12.7 mm) for many applications, and a crest height, h, or double wave amplitude, which may be between about 0.005–0.50 inches (0.13–12.7 mm). For EMI shielding applications, wavelength $\lambda_1$, and accordingly the gaps between the crests 70, may be sized with respect to the wavelength of the incident EMI radiation, such as less than about ¼ of that wavelength for frequencies in the range of 10 MHz–10 GHz, to maintain the required level of EMI shielding. Moreover for EMI shielding applications, it is preferred that a minimum electrical resistivity, typically about 0.1 Ω or less, is maintained per unit length of the gasket 30.

Inboard lateral surface 54 extends intermediate the base and apex surfaces 50 and 52 in forming one side of the gasket body 40. With the other side of the gasket body 40 being formed by the outboard lateral surface 56, a widthwise extent, referenced at w in FIG. 6, of the apex surface 52 is defined therebetween which, for ease of manufacturing the mold or other tooling for gasket 30 via a CNC or wirecut EDM process, may be maintained as generally constant. For assisting in the control of the deflection of the gasket 30 in the manner to be described hereinafter, inboard lateral surface 54 may be configured so as to assume a generally concave profile along axis longitudinal axis 42 intermediate the base and apex surfaces 50 and 52 in having a radius of curvature, referenced at r, in FIG. 6, about the axis 74 which extends generally parallel to longitudinal axis 42. Radius $r_1$ typically may be between about 0.002–0.20 inches (0.05–5.8 mm) for may of the applications herein involved.

Outboard lateral surface 56, in turn, similarly extends intermediate the base surface and apex surfaces 50 and 52 opposite the inboard lateral surface 54. As may be seen with reference to the enhanced view of FIG. 6, outboard lateral surface 56 preferably is inclined along axis 76 from the base surface 50 to the apex surface 52 in the direction of the inboard lateral surface 54 so as to form an acute angle, referenced at θ, with a vertical axis, 78. Such inclination of the lateral surface 56 further assists in the controlled deflection of the gasket 30 as will be described hereinafter.

In accordance with the precepts of the present invention, outboard lateral surface 56 is configured as defining a second waveform profile of the gasket 30. As may be seen best in FIG. 5, such profile, referenced generally at 80 in FIG. 5, is disposed generally transverse to the first waveform profile 53 of apex surface 52 and extends along longitudinal axis 42 in a second periodic series of alternating second high amplitude intervals or crests, one of which is referenced at 82 in FIG. 5, and second low amplitude intervals or troughs, one of which is referenced at 84 in FIG. 5. The second waveform profile 80 defined by outboard lateral surface 56 again may be of any pattern, such as square-wave, ramp, or sawtooth, and may be the same as or different from the pattern of the first waveform 53 profile of apex surface 52. In the illustrated embodiment of FIG. 5, however, the second waveform profile 80 is also shown to be generally sinusoidal in having a convex curvature, such as about a central inclined axis, 86, in the direction indicated by arrow 88 intermediate each successive pair of troughs 84. Each such trough pair also defines a preferably constant wavelength, referenced at $\lambda_2$, therebetween which, in the embodiment of FIG. 5 is about equal to $\lambda_1$ (FIG. 6) of the first waveform profile 53. Preferably, each crest 82 of the second waveform profile 80 is in registration with a corresponding crest 70 of the first waveform profile 53, and each trough 84 of the second waveform profile 80 is in registration with a corresponding trough 72 of the first waveform profile 53 such the first and second waveform profiles are generally in phase along longitudinal axis 42.

Figure 7:
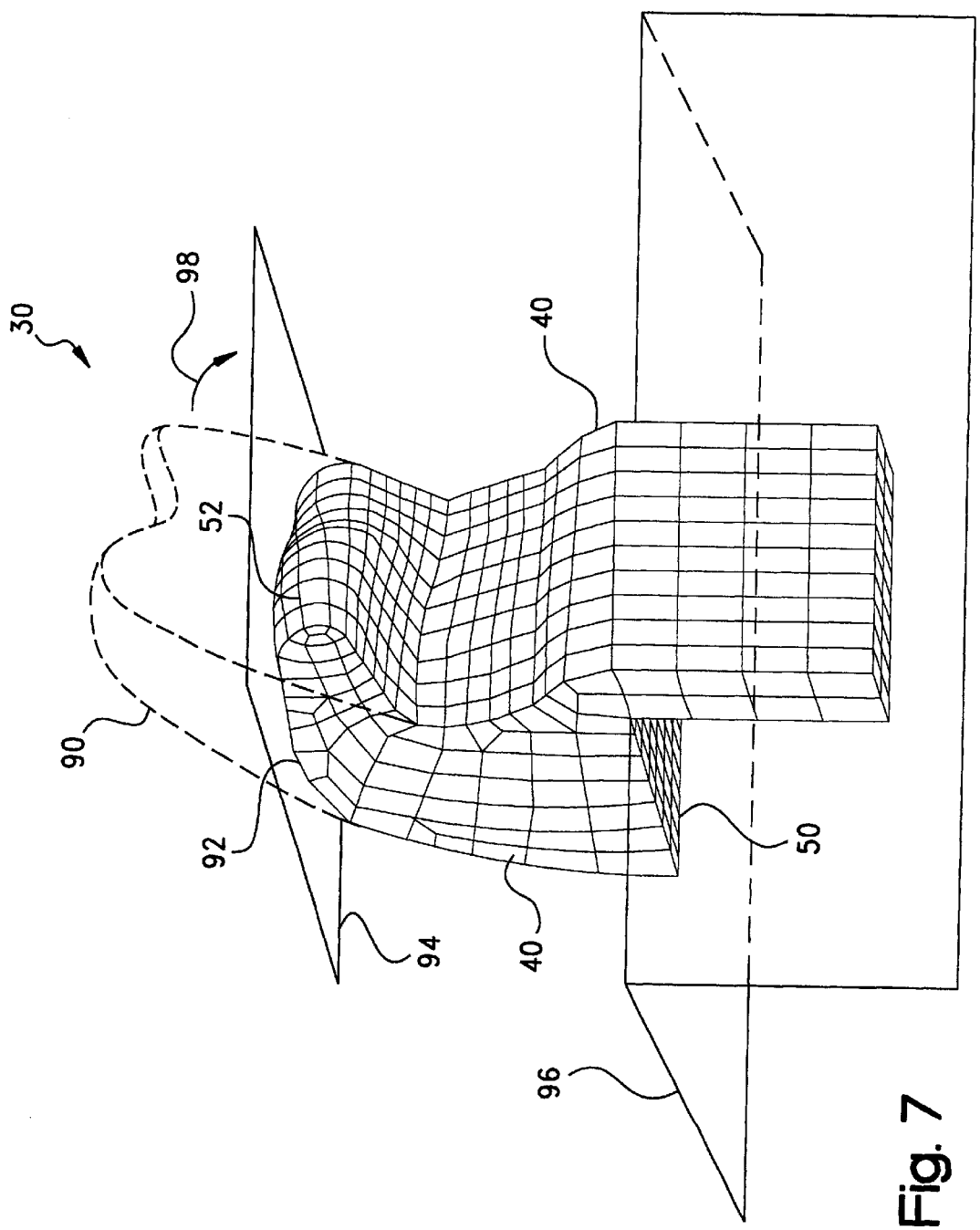
FIG. 7 is 3-D mesh model of a cross-section of the waveform gasket of FIG. 6 showing the deflection response thereof.

By virtue of the provision of a combination of waveform profiles, gasket 30 of the invention is thereby made to exhibit a controlled deflection response when deformed under an axially-directed force between, for example, the edge surface 20 of housing part 12 and a faying interface surface from a mating housing part or other component. Such deformation response of gasket 30 is illustrated in FIG. 7 wherein a 3-D mesh model of a cross-section of gasket 30 is shown in phantom at 90 in an uncompressed or normal orientation which is superimposed over the deformed or stressed orientation referenced at 92 assumed upon the compression of gasket 30 between the interfacing surfaces 94 and 96. As may be seen in FIG. 7, the controlled deflection response 92 of gasket 30 is characterized in that the gasket body 40 is angularly deflected, i.e., bent or folded, intermediate the base and apex surfaces 50 and 52 thereof about a corresponding bending or moment arm in the radial direction referenced by arrow 98. The darker areas of shading in the figure indicate regions of increasing compressive stress.

Figure 8:
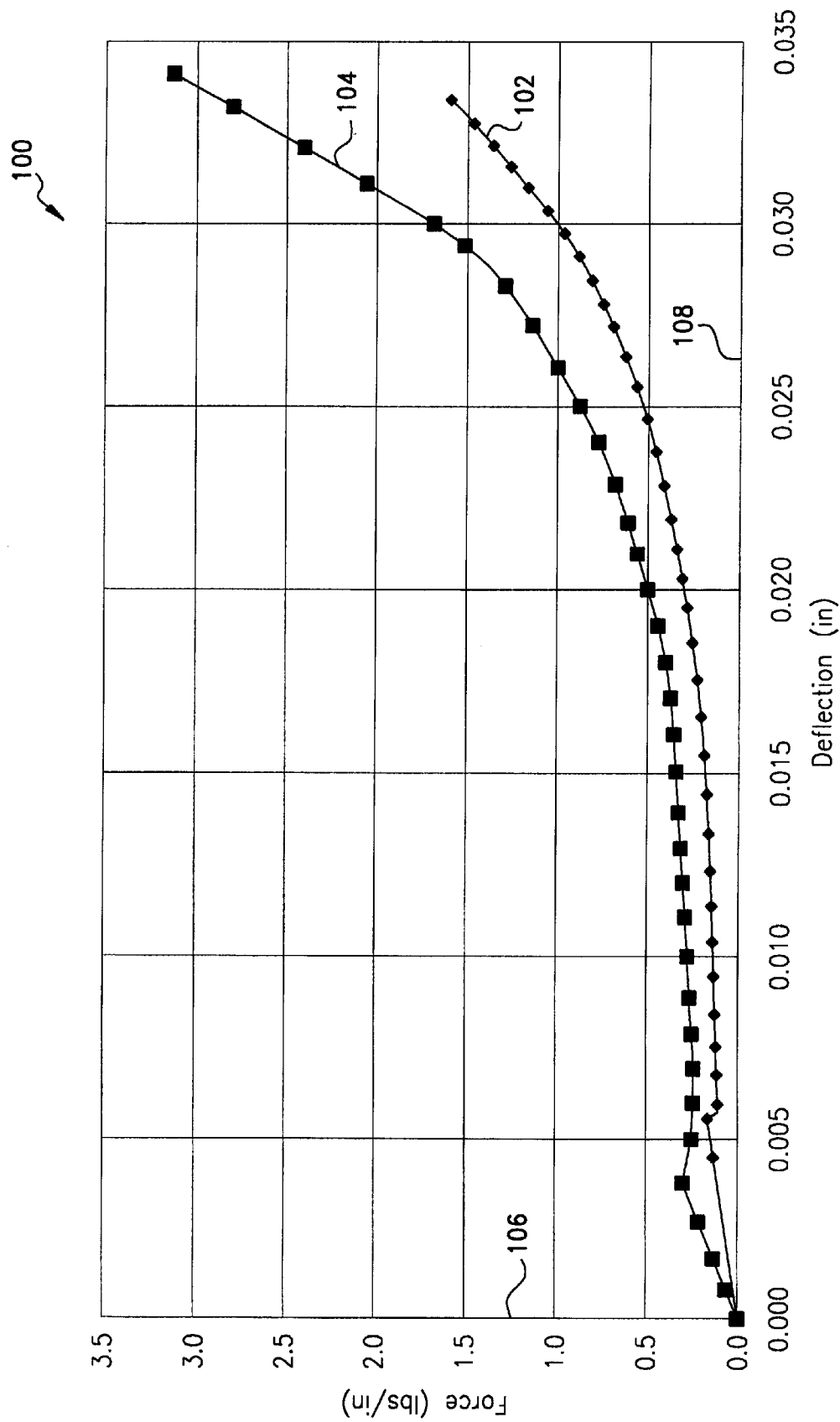
FIG. 8 is a plot comparing the force-deflection responses of the combination waveform gasket of FIG. 7 according to the present invention to a similarly-dimensioned non-waveform gasket.

Advantageously, it has been observed that the provision of such bending mechanism may reduce the load required to effect a given deflection of the gasket 30 by up to about 50% or more as compared to the deflection attainable through the compression of the gasket alone. That is, for a given compressive load, the axial deflection of the gasket 30 according to the present invention may be more than twice the deflection of a gasket of conventional design which does not exhibit the described bending moment. For example, under a compressive load of about 1.0–4.0 $lb_f$/in (0.2–0.8 kg/cm) in a typical application, the gasket of the invention may be deflected by at least about 0.006–0.015 inch (0.15–0.4 mm). The effects of a non-waveform and combination waveform gasket configuration are compared graphically at 100 in FIG. 8. In FIG. 8, normalized load-deflection curves are plotted at 102 and 104 as functions of total load force along the axis designated 106 and deflection displacement along the axis designated 108 for unit lengths of, respectively, the combination waveform gasket profile of FIG. 7 (curve 102), and a comparably dimensioned, i.e., equal top and bottom widths and height, non-waveform profile (curve 104).

From the results of FIG. 8, it may be seen that within a given application, the force required to deflect an combination waveform design will be lower than for a comparable continuous design. Accordingly, it will be appreciated that the gasket of the present invention is especially adapted for use in EMI shielding applications, such as in communication handsets and other handheld devices, which specify a low closure force shielding solution. Indeed, by virtue of the deflection of the gasket, increased surface area contact may be developed between the gasket and the interfacing surface for improved electrical continuity.

The combination waveform design of the present invention, moreover, allows for the direction of the gasket deflection to be changed depending upon the requirements of the particular application. For example, in the assembly 10 of FIGS. 4–6, the direction the deflection of gasket 30 will be inboard, i.e., towards the interior of housing part 12. Alternatively, by reversing the configuration of the lateral surfaces 54 and 56, the deflection of gasket 30 may be outboard, i.e., towards the exterior of housing part 12. Such capability affords greater flexibility in the design of the enclosure. Indeed, although gasket 30 is shown in FIGS. 4–6 to be configured to be supported on one edge surface of the enclosure, it is to be understood that the gasket may be made symmetrical, i.e., with two confronting base surfaces 50 and two oppositely-disposed apex surfaces 52 so as to be supportable on opposing sides of a substrate such as the spacer gasket frames further described in commonly-assigned, co-pending application U.S. Ser. No. 08/377,412 filed Jan. 24, 1995, and in U.S. Pat. No. 5,731,541.

The Example to follow is illustrative of the practicing and unique features of the invention herein involved, but should not be construed in any limiting sense.

EXAMPLE

Figure 9A:
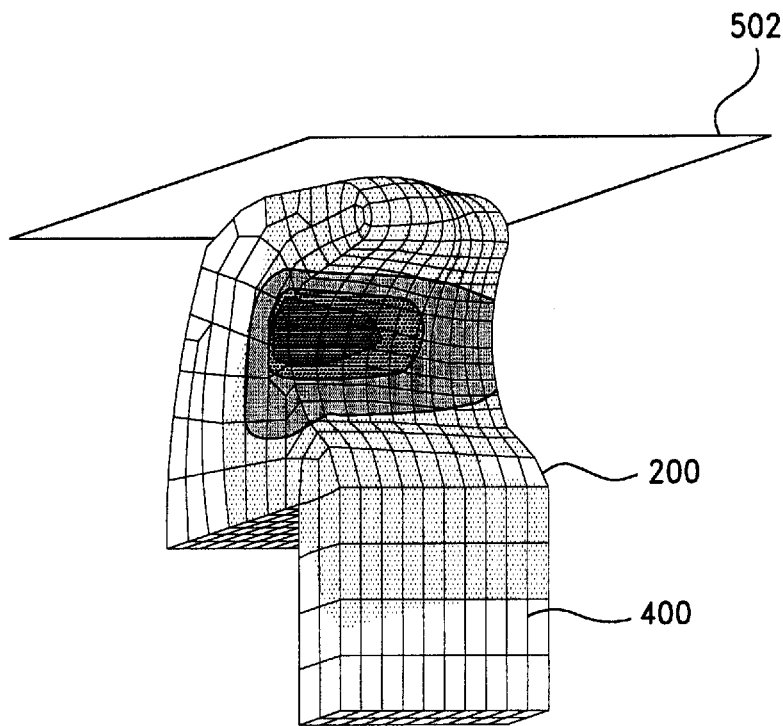
FIG. 9A is a 3-D graphical representation of a finite element model of the predicted stress distribution at 0.020-inch (0.50 mm) deflection in a representative waveform gasket profile of the present invention.
Figure 9B:
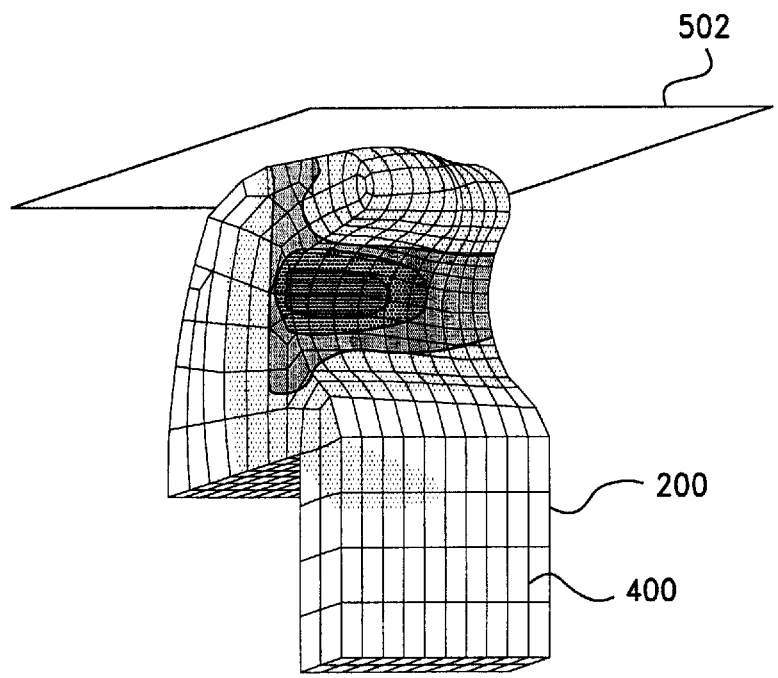
FIG. 9B is a 3-D graphical representation of the stress distributions of the gasket profile of FIG. 9A at 0.025-inch (0.635 mm) deflection.
Figure 10A:
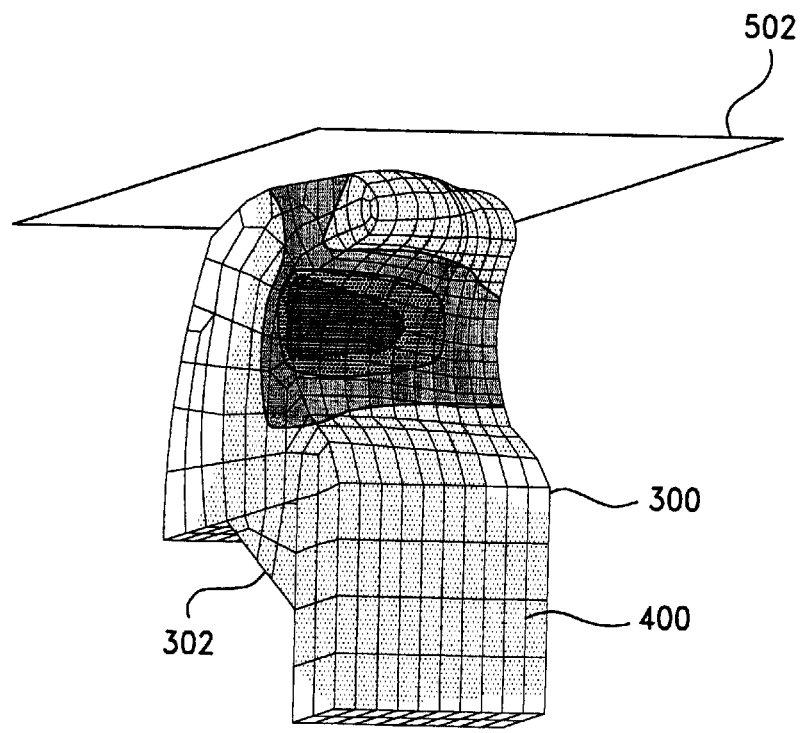
FIG. 10A is a 3-D graphical representation of a finite element model of the stress distributions at 0.020-inch (0.50 mm) deflection in an alternative embodiment of a waveform gasket profile of the present invention.
Figure 10B:
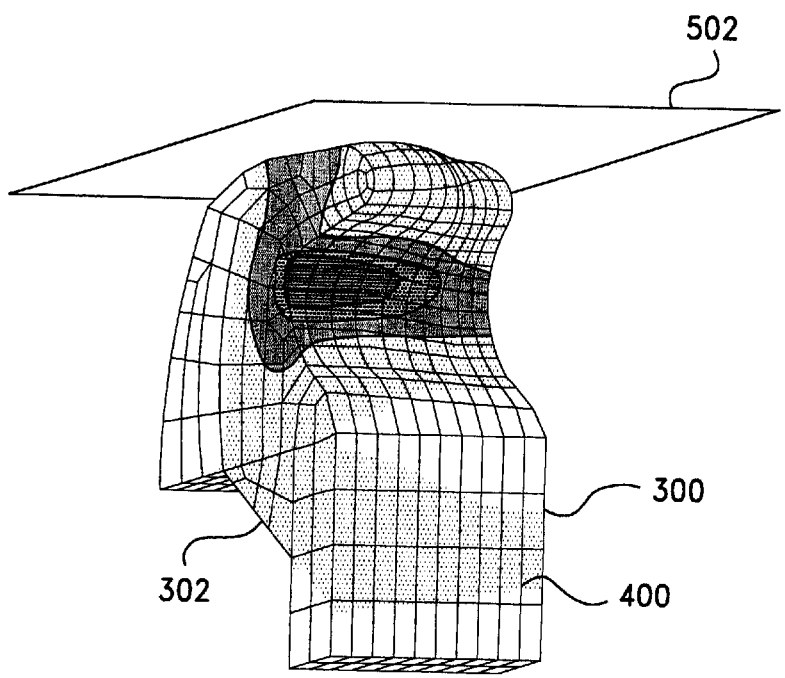
FIG. 10B is a 3-D graphical representation of the stress distributions of the gasket profile of FIG. 10A at 0.025-inch (0.635 mm) deflection.

To confirm the precepts of the present invention, the static load-deflection responses of two gasket profiles configured in accordance with the invention were predicted using a nonlinear finite element analysis (FEA) modeling program, MARC K6 (MARC Analysis Research Corp., Palo Alto, Calif.). The results for the gasket profiles identified at 200 in FIGS. 9A and 9B and at 300 in FIGS. 10A and 10B are plotted for the second component of Cauchy stress at a deflection of 0.020 inch (0.50 mm) for FIGS. 9A and 10A and 0.025 inch (0.635 mm) for FIGS. 9B and 10B. The profiles were modeled using eight-node 3-D Hermann elements which are represented by the grid lines commonly referenced at 400.

The compression of the profiles 200 and 300 was simulated using a contact element which is shown as the plane commonly referenced at 502. The opposing edge surface (not shown) was considered in the analysis as a rigid body relative to the gasket profiles. Profile 300 of FIGS. 10A and 10B may be seen to differ from profile 200 of FIGS. 9A and 9B essentially in having a base surface 50 which includes an angled portion, 302, for supporting the profile 300 on a correspondingly chamfered edge surface.

Based upon the above models, the load-deflection responses of the gasket profiles were predicted by finite element analysis using the Mooney-Rivlin strain energy function, $$W = C_1(I_1-3) + C_2(I_2-3) \quad (1)$$

where $C_1$, $C_2$, are material coefficients, and $I_1$, $I_2$ are strain invariants, which reduces to the Ogden function, $$W = \sum_{i=1}^{m} \frac{\mu i}{\alpha i}(\lambda_1^{\alpha i} + \lambda_2^{\alpha i} + \lambda_3^{\alpha i} - 3) \quad (2)$$

where $\lambda_1$, $\lambda_2$, $\lambda_3$ are the stretch ratios and $\alpha_i$, $\mu_i$ are the material coefficients. For a two-term Ogden model, i.e., m=2, Eqs. 1 and 2 are equivalent. Table 1 summarizes the two-term Ogden constants and the bulk modulus, which was used to account for the near incompressibility of elastomeric materials, of a representative silicone-based, filled elastomeric molding material.

TABLE 1

Representative Ogden Model Material Constants

| Bulk Modulus | K = | 200,000 psi |
|---|---|---|
| Ogden Constants | $\mu_1$ = | −173 psi |
| | $\mu_2$ = | −522 psi |
| | $\alpha_1$ = | 2 |
| | $\alpha_2$ = | −2 |

In the FEA models of FIGS. 9 and 10, the predicted stress component distribution in the vertical direction are shown by contour shading with the darker areas indicating regions of increasing compressive stress. The bending mechanism responses of the profiles may be seen to appreciably reduce the force required to deflect the gasket. Of course, based on the foregoing simulations, gasket geometries other that those shown in FIGS. 8 and 9 may be envisioned which incorporate this bending mechanism feature. These other geometries therefore are to be considered to be within the scope of the present invention.

Figure 11:
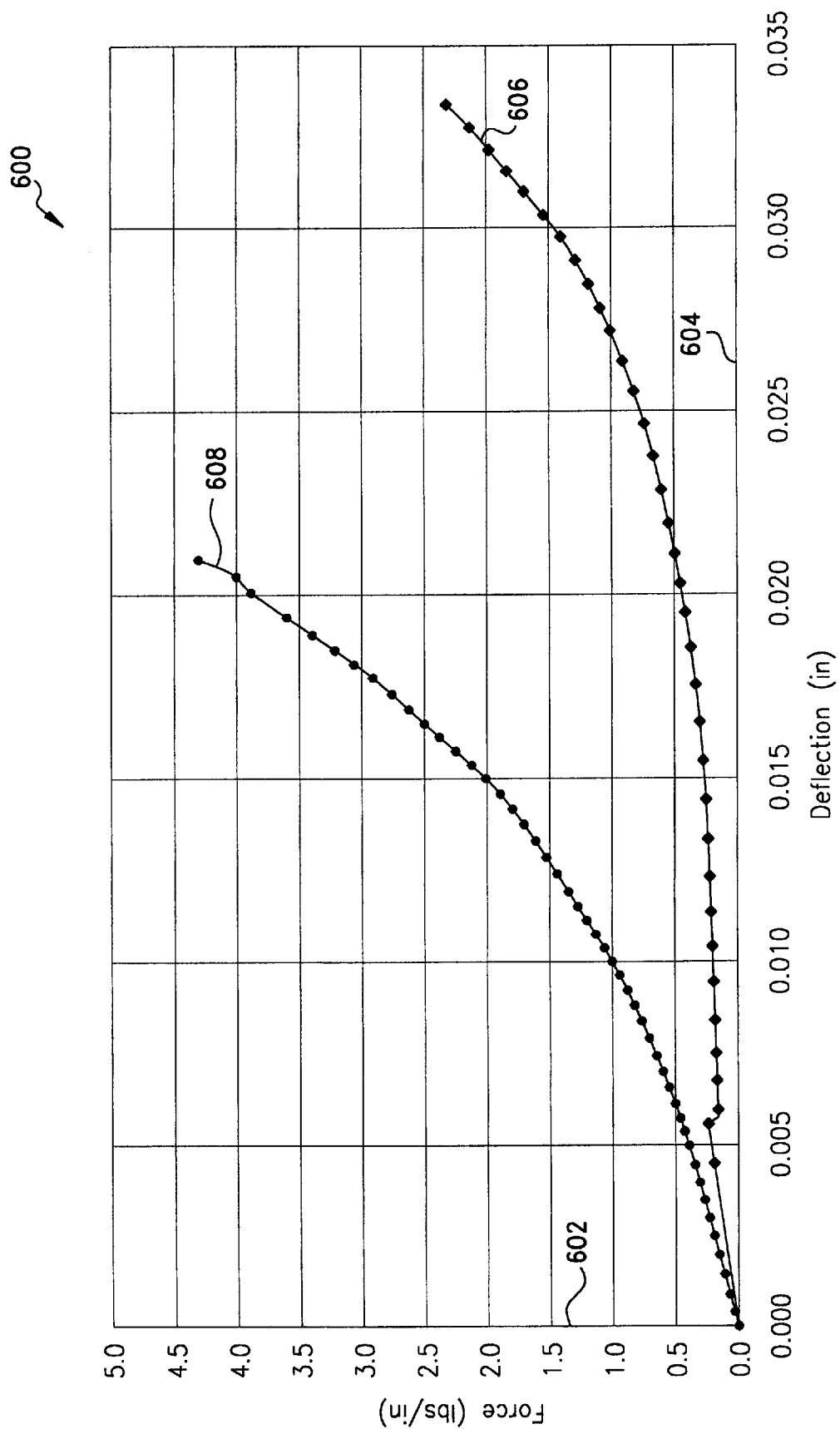
FIG. 11 is a plot comparing the force-deflection responses of the combination waveform gasket of FIG. 9 according to the present invention to the conventional waveform gasket of FIG. 1.

Quantitatively, the effect of the described bending response is modeled at 600 in FIG. 11 wherein normalized load force (axis 602) versus deflection (axis 604) curves are plotted for unit lengths of the combination waveform gasket profile of FIG. 9 (curve 606) and the conventional, i.e., without bending, waveform profile of FIG. 1 (curve 608). The respective gasket profiles used for the models were comparably dimensioned as having equal top and bottom widths and equal heights.

From FIG. 11, it may be seen that the provision of the described bending mechanism may reduce the load required to effect a given deflection of a waveform gasket by up to about 50% or more as compared to the deflection attainable through the compression of the gasket alone. That is, for a given compressive load, the axial deflection of the combination waveform gasket according to the present invention (curve 606) may be more than twice the deflection of a gasket of conventional design (curve 608) which does not exhibit the described bending moment. For example, under a compressive load of about 1.0–2.0 lb$_f$/in (0.2–0.4 kg/cm) which typically is specified for miniature electronic devices or other very low closure force applications, the combination waveform gasket of the invention may be deflected by at least about 0.03–0.035 inch (0.76–0.89 mm) as compared to only about 0.01–0.015 inch (0.25–0.38 mm) for the conventional profile. It will be appreciated that the bending mechanism response increases the range of deflection for the gasket profile of the present invention making it suitable for use in a variety of applications.

As it is anticipated that certain changes may be made in the present invention without departing from the precepts herein involved, it is intended that all matter contained in the foregoing description shall be interpreted as illustrative and not in a limiting sense. All references cited herein are expressly incorporated by reference.

What is claimed is:

1. A resilient gasket for interposition between a first interface surface and an oppositely-disposed second interface surface, said gasket comprising an elongate body of indefinite length which extends along a longitudinal axis, said body including:

a base surface which extends along the length said body, said base surface being configured for proximally supporting said gasket on the first interface surface;

an apex surface which extends radially from said longitudinal axis for distal contact with the second interface surface, said apex surface extending along said longitudinal axis as defining a first waveform profile characterized as having a first periodic series of alternating first high and low amplitude intervals;
a first lateral surface extending intermediate said base surface and said apex surface; and
a second lateral surface extending intermediate said base surface and said apex surface opposite said first lateral surface,
whereby said gasket is deformable under a predetermined compressive force between the first and second interface surfaces into a stressed orientation characterized in that said body is deflected intermediate said base surface and said apex surface.

2. The gasket of claim 1 wherein said second lateral surface extends along said longitudinal axis in defining a second waveform profile disposed generally transverse to said first waveform profile and characterized as having a second periodic series of alternating second high and low amplitude intervals.

3. The gasket of claim 2 wherein the first high and low amplitude intervals of said first periodic series are generally in phase with the second high and low amplitude intervals of said second periodic series.

4. The gasket of claim 2 wherein said second waveform profile is generally sinusoidal.

5. The gasket of claim 2 wherein said first and said second waveform profile each is generally sinusoidal.

6. The gasket of claim 1 wherein said body is generally curvilinear.

7. The gasket of claim 1 wherein said first waveform profile is generally sinusoidal.

8. The gasket of claim 1 wherein in said stressed orientation of said gasket said body is deflected towards said first lateral surface.

9. The gasket of claim 1 wherein said body is generally rectilinear.

10. The gasket of claim 1 wherein said first lateral surface is generally concave.

11. The gasket of claim 1 wherein said second lateral surface is angled towards said first lateral surface.

12. The gasket of claim 1 wherein said body is formed of an elastomeric polymeric material.

13. The gasket of claim 12 wherein said polymeric material contains an electrically-conductive filler.

14. A sealing assembly comprising:
a first interface surface; and
a resilient gasket compressible between said first interface surface and an oppositely-disposed second interface surface, said gasket comprising an elongate body of indefinite length which extends along a longitudinal axis, said body including:
a base surface which extends along the length of said body, said base surface being proximally supported on said first interface surface;
an apex surface which extends radially from said longitudinal axis for distal contact with the second interface surface, said apex surface extending along said first axis as defining a first waveform profile characterized as having a first periodic series of alternating first high and low amplitude intervals;
a first lateral surface extending intermediate said base surface and said apex surface; and
a second lateral surface extending intermediate said base surface and said apex surface opposite said first lateral surface,
whereby said gasket is deformable under a predetermined compressive force between the first and second interface surfaces into a stressed orientation characterized in that said body is deflected intermediate said base surface and said apex surface.

15. The sealing assembly of claim 14 wherein said second lateral surface extends along said first axis as defining a second waveform profile disposed generally transverse to said first waveform profile and characterized as having a second periodic series of alternating second high and low amplitude intervals.

16. The sealing assembly of claim 15 wherein the first high and low amplitude intervals of said first periodic series are generally in phase with the second high and low amplitude intervals of said second periodic series.

17. The sealing assembly of claim 15 wherein said second waveform profile is generally sinusoidal.

18. The sealing assembly of claim 15 wherein said first and said second waveform profile each is generally sinusoidal.

19. The sealing assembly of claim 14 wherein said body is generally curvilinear.

20. The sealing assembly of claim 14 wherein said first waveform profile is generally sinusoidal.

21. The sealing assembly of claim 14 wherein in said stressed orientation of said gasket said body is deflected towards said first lateral surface.

22. The sealing assembly of claim 14 wherein said body is generally rectilinear.

23. The sealing assembly of claim 14 wherein said first lateral surface is generally concave.

24. The sealing assembly of claim 14 wherein said second lateral surface is angled towards said first lateral surface.

25. The sealing assembly of claim 14 wherein said body is formed of an elastomeric polymeric material.

26. The sealing assembly of claim 25 wherein said polymeric material contains an electrically-conductive filler.

* * * * *